(12) United States Patent
Lee et al.

(10) Patent No.: US 12,139,789 B2
(45) Date of Patent: Nov. 12, 2024

(54) PROCESS STOP LOSS REDUCTION SYSTEM THROUGH RAPID REPLACEMENT OF APPARATUS FOR TRAPPING OF REACTION BY-PRODUCT FOR SEMICONDUCTOR PROCESS

(71) Applicant: MILAEBO CO., LTD., Pyeongtaek-si (KR)

(72) Inventors: Yeon Ju Lee, Hwaseong-si (KR); In Hwan Kim, Osan-si (KR); Sung Won Yoon, Siheung-si (KR); In Mun Hwang, Hwaseong-si (KR)

(73) Assignee: MILAEBO CO., LTD., Pyeongtaek-si (KR)

( * ) Notice: Subject to any disclaimer, the term of this patent is extended or adjusted under 35 U.S.C. 154(b) by 10 days.

(21) Appl. No.: 18/298,486

(22) Filed: Apr. 11, 2023

(65) Prior Publication Data
US 2024/0186154 A1    Jun. 6, 2024

(30) Foreign Application Priority Data

Dec. 6, 2022   (KR) .......................... 10-2022-0168901

(51) Int. Cl.
*C23C 16/44*   (2006.01)
*G05D 7/06*   (2006.01)
*H01J 37/32*   (2006.01)
*H01L 21/67*   (2006.01)

(52) U.S. Cl.
CPC ....... *C23C 16/4412* (2013.01); *G05D 7/0652* (2013.01); *H01J 37/32834* (2013.01); *H01J 37/32844* (2013.01); *H01L 21/67017* (2013.01)

(58) Field of Classification Search
CPC ............ C23C 16/4412; H01J 37/32834; H01J 37/32844; H01L 21/67017
See application file for complete search history.

(56) References Cited

U.S. PATENT DOCUMENTS

| | | | |
|---|---|---|---|
| 2003/0009311 A1* | 1/2003 | Ushiku | F04D 19/04 702/184 |
| 2019/0282948 A1* | 9/2019 | Mahawili | B01D 53/78 |
| 2022/0112598 A1* | 4/2022 | Iyer | C23C 16/4412 |

FOREIGN PATENT DOCUMENTS

| | | |
|---|---|---|
| JP | 10-284474 A | 10/1998 |
| KR | 10-0544320 B1 | 1/2006 |
| KR | 10-0647725 B1 | 11/2006 |

(Continued)

*Primary Examiner* — Atif H Chaudry
(74) *Attorney, Agent, or Firm* — You & IP, LLC

(57) ABSTRACT

Disclosed is a process stop loss reduction system, in which in case that pressure in a trapping apparatus and pressure in a process chamber are increased because of space clogging or the like caused by reaction by-products while the trapping apparatus for trapping of a reaction by-product contained in exhaust gas discharged from the process chamber operates over a long period of time during a semiconductor process, only the trapping apparatus, in which an exhaust gas supply flow path is blocked, may be quickly replaced while inert gas, instead of the exhaust gas, is received in an idle state and continuously supplied to the vacuum pump through a bypass pipe without stopping an operation of (shutting down) a semiconductor manufacturing process chamber facility, and then the trapping apparatus may be supplied with the exhaust gas again as the flow path is changed.

8 Claims, 5 Drawing Sheets

(56) References Cited

FOREIGN PATENT DOCUMENTS

| KR | 10-0930320 B1 | 12/2009 |
|----|---------------|---------|
| KR | 10-2010-0011823 A | 2/2010 |
| KR | 10-2011-0097395 A | 8/2011 |
| KR | 10-2022-0081116 | 6/2022 |

* cited by examiner

PROCESS STOP LOSS REDUCTION SYSTEM THROUGH RAPID REPLACEMENT OF APPARATUS FOR TRAPPING OF REACTION BY-PRODUCT FOR SEMICONDUCTOR PROCESS

CROSS-REFERENCE TO RELATED APPLICATIONS

This application claims the priority of Korean Patent Application No. 10-2022-0103093 filed on Aug. 18, 2022, in the Korean Intellectual Property Office, the disclosure of which is incorporated herein by reference.

BACKGROUND

Field

The present disclosure relates to a process stop loss reduction system through rapid replacement of an apparatus for trapping of a reaction by-product for a semiconductor process, and more particularly, to a process stop loss reduction system capable of proceeding with semiconductor production by quickly replacing a trapping apparatus without a process stop loss such as preparation of replacement of the trapping apparatus and replacement and maintenance time, i.e., without stopping an operation of a semiconductor manufacturing process chamber in case that pressure in the trapping apparatus and pressure in the process chamber are increased by space clogging or the like caused by reaction by-products accumulated in the trapping apparatus for trapping of a reaction by-product contained in exhaust gas discharged from the process chamber during a semiconductor process.

DESCRIPTION OF THE RELATED ART

In general, semiconductor manufacturing processes broadly include a pre-process (fabrication process) and a post-process (assembly process).

The pre-process refers to a process of manufacturing a semiconductor chip by forming particular patterns by repeatedly performing processes of depositing thin films on a wafer in various types of process chambers and selectively etching the deposited thin films.

In addition, the post-process refers to a package process of assembling a finished product by independently cutting and separating the chips manufactured on the wafer in the pre-process and coupling the chips to a lead frame.

The pre-process refers to a process of depositing the thin film on the wafer or etching the thin film deposited on the wafer. To this end, the semiconductor manufacturing process is performed at a high temperature by injecting a gas selected from various process gases including $TiCl_4$ (titanium tetrachloride), $NH_3$ (ammonia), $SiH_4$ (monosilane), $SiCl_2H_2$ (dichlorosilane), $WF_6$ (tungsten hexafluoride), Hf (hafnium), and the like into the process chamber depending on the required semiconductor manufacturing process. In this case, various types of non-deposited reaction by-products, unreacted ignitable gases, and harmful gases containing corrosive foreign substances and toxic substances are produced in large amount in the process chamber during the reaction process.

In order to remove and discharge the harmful gases, a semiconductor manufacturing facility is installed with a vacuum pump for creating a vacuum state in the process chamber that continuously operates, and a scrubber installed at a rear end of the vacuum pump and configured to purify exhaust gas discharged from the process chamber and then discharge the exhaust gas into the atmosphere.

However, because the scrubber purifies and treats only gaseous reaction by-products, the reaction by-product, which is discharged to the outside of the process chamber and then solidified, is adhered to an exhaust pipe, which causes problems of an increase in exhaust pressure, a breakdown of a vacuum pump caused by the reaction by-product introduced into the vacuum pump, and contamination of the wafer caused by a reverse flow of harmful gas into the process chamber.

For this reason, the semiconductor manufacturing facility is generally installed with a reaction by-product trapping apparatus installed between the process chamber and the vacuum pump to trap the reaction by-product contained in the exhaust gas discharged from the process chamber.

If the trapping apparatus cannot smoothly treat the exhaust gas introduced from the process chamber, the exhaust gas is introduced into the vacuum pump and the scrubber, which causes a breakdown of the pump and contamination of the wafer caused by a reverse flow of harmful gas into the process chamber during a high-quality, high-efficiency process of producing the wafer. Therefore, the trapping apparatus is a very important apparatus for the semiconductor production process.

In case that pressure in the trapping apparatus and pressure in the process chamber are increased because of space clogging or the like caused by the reaction by-product accumulated as the trapping apparatus performs the trapping operation for the above-mentioned purposes over a long period of time, the operation of the semiconductor production process cannot be performed. Therefore, a controller for controlling the process chamber facility stops a supply of process gas into the process chamber, and then the trapping apparatus is replaced.

When the operation of the process chamber is stopped by the controller for controlling the process chamber facility, a defect rate of a semiconductor in the process chamber. Therefore, the semiconductor is removed, and then a process of replacing or cleaning the trapping apparatus is performed.

The reason why the wafer is removed is that the wafer present in the process chamber and used to manufacture the semiconductor is contaminated and thus needs to be discarded because the trapping apparatus is detached after the process chamber at the front end and the exhaust pipe (or vacuum pipe) connected to the vacuum pump at the rear end are removed in the state in which the operations of the process chamber and the vacuum pump are stopped to replace or clean the trapping apparatus.

Thereafter, in case that the trapping apparatus is newly replaced, a process of connecting and remounting the process chamber at the front end and the vacuum pump at the rear end is performed.

In addition, an inner trapping tower installed in the trapping apparatus detached for the cleaning process is separated, and then the reaction by-product trapped or adhered in the inner trapping tower and a trapping apparatus housing are clearly removed. Thereafter, the process of connecting and remounting the process chamber at the front end and the vacuum pump at the rear end is performed on the cleaned trapping apparatus.

In this case, if the process chamber of the trapping apparatus operates immediately after the process chamber and the vacuum pump are connected, a vacuum condition, a condition related to presence or absence of foreign substances, or various types of conditions do not conform to a condition for optimal semiconductor production. Therefore, the trapping process is started after various types of inspection processes are performed.

About 48 hours are typically required to stop the operation of the process chamber facility, replace or clean the trapping apparatus, and set the optimal environmental condition, and then operate process chamber facility again.

As described above, because the process stop causes a large amount of time required for the semiconductor production process, there is a structural problem in that semiconductor production costs are increased.

Therefore, in the related art, a system has been proposed in which trapping apparatuses are provided as a dual system to continuously perform a semiconductor production process without stopping a process chamber facility, such that in case that one trapping apparatus cannot perform a normal trapping process, the other trapping apparatus operates, which is stopped, is replaced or cleaned, thereby enabling a continuous operation.

However, because two facilities and two installation spaces are required to provide the trapping apparatuses as the dual system, there is a problem in that it is difficult to reduce the semiconductor production costs.

DOCUMENT OF RELATED ART

Patent Documents (Patent Document 1) Korean Patent No. 10-0544320 (Jan. 11, 2006)
(Patent Document 2) Korean Patent No. 10-0647725 (Nov. 13, 2006)
(Patent Document 3) Korean Patent No. 10-0930320 (Nov. 30, 2009)
(Patent Document 4) Korean Patent Application Laid-Open No. 10-2022-0081116 (Jun. 15, 2022)

SUMMARY

An object to be achieved by the present disclosure is to provide a process stop loss reduction system, in which in case that pressure in a trapping apparatus and pressure in a process chamber are increased because of space clogging or the like caused by reaction by-products while the trapping apparatus for trapping of a reaction by-product contained in exhaust gas discharged from the process chamber operates over a long period of time during a semiconductor process, only the trapping apparatus, in which an exhaust gas supply flow path is blocked, may be quickly replaced while inert gas, instead of the exhaust gas, is received in an idle state and continuously supplied to the vacuum pump through a bypass pipe without stopping an operation of (shutting down) a semiconductor manufacturing process chamber facility, and then the trapping apparatus may be supplied with the exhaust gas again as the flow path is changed.

Another object to be achieved by the present disclosure is to provide a process stop loss reduction system, in which a configuration capable of quickly replacing a reaction by-product trapping apparatus is provided, such that the trapping apparatus may be quickly replaced by controlling flow paths for supplying inert gas and exhaust gas in an idle state in which a semiconductor wafer manufacturing process environment is maintained in a process chamber without stopping an operation of (shutting down) a process chamber facility for manufacturing a semiconductor, and then the trapping apparatus may trap a reaction by-product contained in discharged exhaust gas by immediately inputting process gas into a process chamber again to proceed with a semiconductor manufacturing process without performing a process of resetting and evaluating an environmental condition for performing the semiconductor production process again and without performing a process of detaching or remounting a connection pipe between a vacuum pump and the process chamber connected to the trapping apparatus.

According to an aspect of the present disclosure, a process stop loss reduction system through rapid replacement of an apparatus for trapping of a reaction by-product for a semiconductor process includes a trapping apparatus configured to trap a reaction by-product in exhaust gas discharged from a process chamber during a semiconductor process, the process stop loss reduction system including: a distributor configured to distribute exhaust gas or inert gas, which is supplied from the process chamber, to a flow path; a first on-off valve configured to open or close the flow path for the exhaust gas or the inert gas distributed by the distributor; a second on-off valve configured to open or close the flow path for the inert gas distributed by the distributor; a trapping apparatus having an inner trapping apparatus configured to receive the exhaust gas in response to the opening or closing of the first on-off valve and trap a reaction by-product or receive the inert gas; a bypass pipe configured to receive the inert gas in response to the opening or closing of the second on-off valve and supply the inert gas to an exhaust pipe at a lower side of a heating gate valve; the heating gate valve configured to receive the exhaust gas or the inert gas from the trapping apparatus when the first on-off valve is opened and supply the exhaust gas or the inert gas to an exhaust pipe connected to a vacuum pump at a rear end or cut off the supply of the exhaust gas or the inert gas; and a trapping system controller configured to control operations of opening or closing the first on-off valve, the second on-off valve, and the heating gate valve.

In the exemplary embodiment, the first on-off valve or the second on-off valve may be controlled by the trapping system controller so that a flow path thereof is opened or closed, the first on-off valve may be configured to supply the supplied exhaust gas or inert gas to the trapping apparatus, and the second on-off valve may be configured to supply the supplied inert gas to the bypass pipe.

In the exemplary embodiment, the first on-off valve and the second on-off valve may each have a heating function.

In the exemplary embodiment, the trapping apparatus may be configured to receive the inert gas from the process chamber as the first on-off valve and the heating gate valve are controlled to be opened, receive the exhaust gas, and then trap the reaction by-product when a predetermined time elapses after the trapping apparatus is replaced.

In the exemplary embodiment, the bypass pipe may be connected to the exhaust pipe at the lower side of the heating gate valve.

In the exemplary embodiment, the heating gate valve, at ordinary times, may prevent formation of a by-product in the valve by raising a temperature to allow the system to operate smoothly.

In the exemplary embodiment, the trapping system controller, at ordinary times, may perform control to allow the heating gate valve to communicate with the trapping apparatus through the flow path by closing the second on-off valve and opening the first on-off valve, and when a process chamber facility controller detects a change in pressure in the trapping apparatus or the process chamber and then supplies the inert gas into the process chamber instead of process gas, the trapping system controller, which operates in conjunction with the process chamber facility controller in response to a signal, may perform control to open the second on-off valve, block a flow path of the first on-off valve, switch the flow path from the trapping apparatus to the bypass pipe, block a flow path of the heating gate valve, and supply the inert gas to the exhaust pipe at the lower side of the heating gate valve through the bypass pipe, such that the trapping apparatus is capable of being replaced.

In the exemplary embodiment, when replacement of the trapping apparatus is completed, the trapping system controller may perform control to connect the heating gate valve in a closed state to the trapping apparatus to open a flow in the flow path, open the first on-off valve, close the second on-off valve, and switch the flow path from the bypass pipe to the trapping apparatus, such that the inert gas discharged from the process chamber is discharged to the vacuum pump at the rear end through the trapping apparatus, and then the process chamber restarts a process of producing a semiconductor, such that the trapping apparatus receives the exhaust gas, traps the reaction by-product, and then discharges the remaining exhaust gas, and the exhaust gas is discharged to the vacuum pump at the rear end.

In the exemplary embodiment, the process stop loss reduction system through rapid replacement of an apparatus for trapping of a reaction by-product for a semiconductor process may be configured to replace the trapping apparatus in an idle state in which a semiconductor wafer manufacturing process environment is maintained in the process chamber in which a semiconductor wafer is being manufactured without stopping an operation of a process chamber facility.

According to the process stop loss reduction system through rapid replacement of an apparatus for trapping of a reaction by-product for a semiconductor process according to the present disclosure having the above-mentioned features, in case that the pressure in the trapping apparatus and the pressure in the process chamber are increased because of space clogging or the like caused by the reaction by-products while the trapping apparatus for trapping of a reaction by-product contained in exhaust gas discharged from the process chamber operates over a long period of time during the semiconductor process, only the trapping apparatus, in which an exhaust gas supply flow path is blocked, may be quickly replaced while inert gas, instead of the exhaust gas, is received in the idle state and continuously supplied to the vacuum pump through the bypass pipe of the trapping apparatus without stopping an operation of (shutting down) the semiconductor manufacturing process chamber facility, and then the trapping apparatus may trap the reaction by-product when the process gas is supplied to the process chamber again and the exhaust gas is discharged as the flow path is changed.

In addition, according to the process stop loss reduction system through rapid replacement of an apparatus for trapping of a reaction by-product for a semiconductor process according to the present disclosure, the configuration capable of quickly replacing the reaction by-product trapping apparatus is provided, such that the trapping apparatus may be quickly replaced by controlling flow paths for supplying inert gas and exhaust gas in the idle state in which the semiconductor wafer manufacturing process environment is maintained in a process chamber, which is being used to manufacture the semiconductor wafer, without stopping the operation of (shutting down) the process chamber facility for manufacturing a semiconductor, and then the trapping apparatus may trap a reaction by-product contained in discharged exhaust gas by immediately inputting process gas into the process chamber again to proceed with the semiconductor manufacturing process without performing a process of resetting and evaluating an environmental condition for performing the semiconductor production process again and without performing a process of detaching or remounting the connection pipe between the vacuum pump and the process chamber connected to the trapping apparatus.

In addition, according to the present disclosure, the semiconductor production process is quickly performed again within about three hours without stopping the operation of (shutting down) the process chamber facility, which makes it possible to improve the process operating time and the productivity by reducing the semiconductor stop loss time.

The present disclosure is a useful invention having many effects as described above and is an invention that is highly expected to be used in industry.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENT

Hereinafter, configurations and operations of embodiments of the present disclosure will be described in detail with reference to the accompanying drawings. In addition, in the description of the present disclosure, the specific descriptions of related well-known functions or configurations will be omitted when it is determined d that the specific descriptions may unnecessarily obscure the subject matter of the present disclosure.

Figure 1:
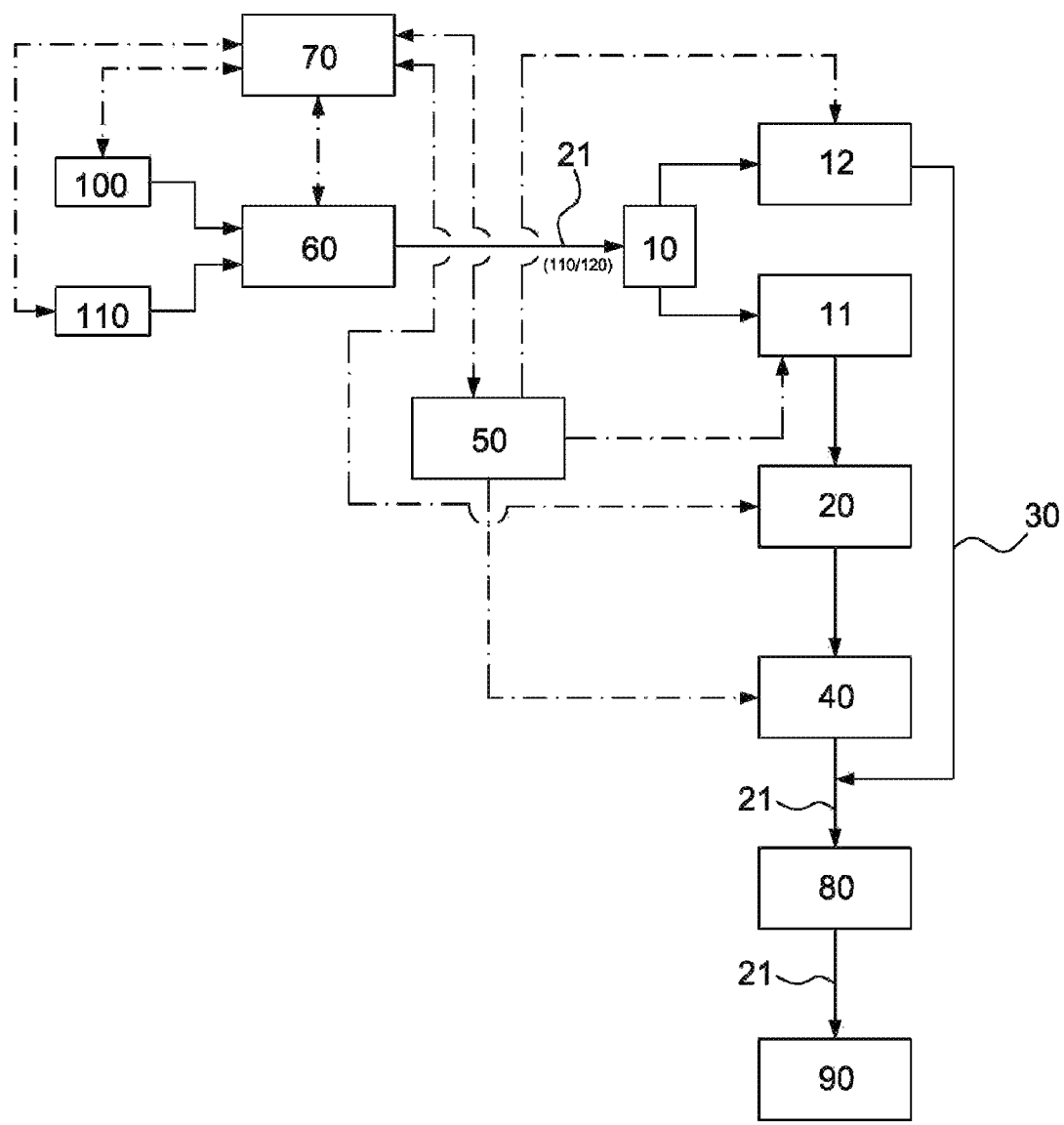
FIG. 1 is an overall configuration view of a process stop loss reduction system according to an embodiment of the present disclosure.
Figure 2:
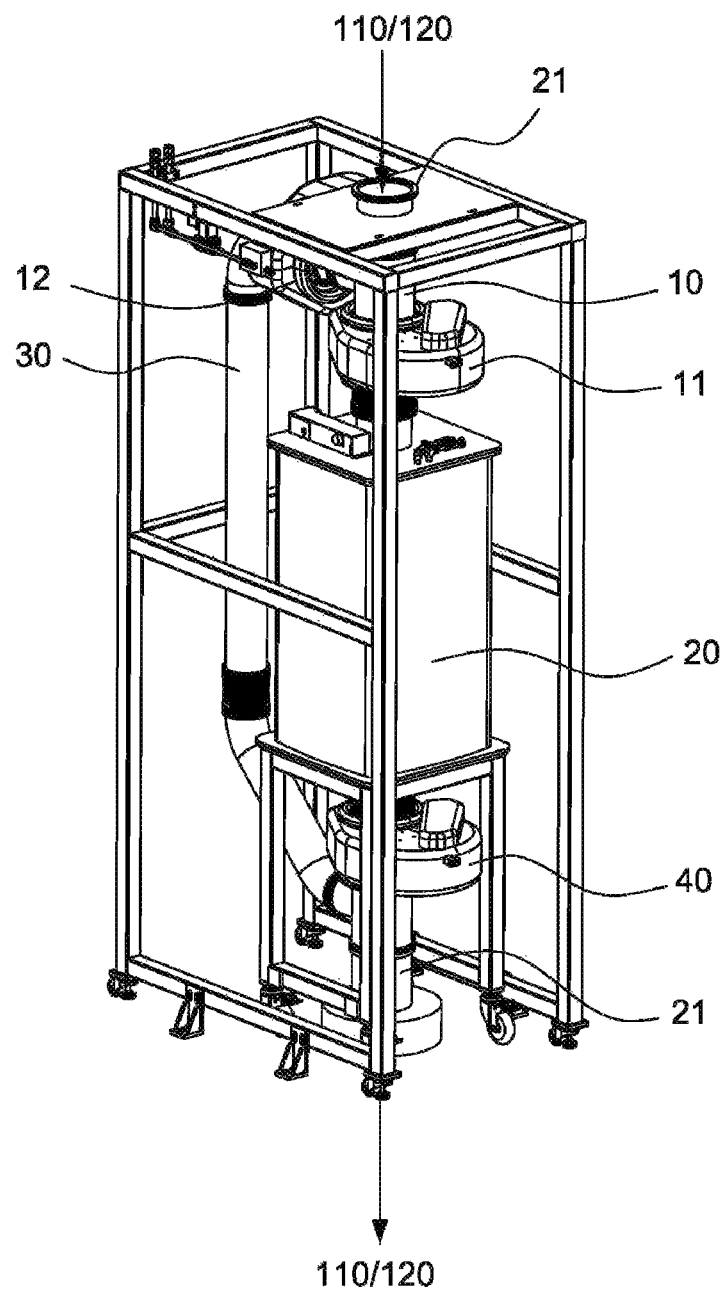
FIGS. 2 to 4 are exemplified views illustrating a main configuration of the process stop loss reduction system according to the embodiment of the present disclosure.
Figure 3:
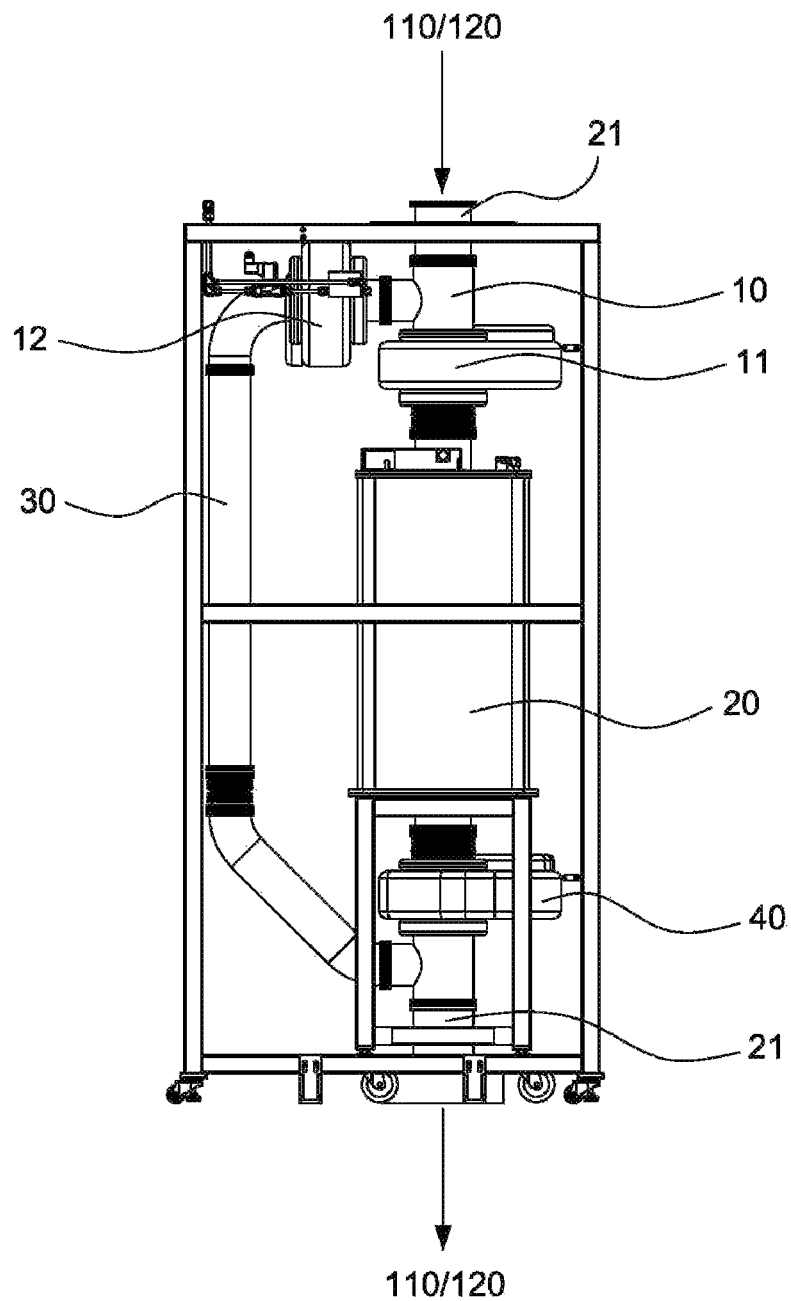
Figure 4:
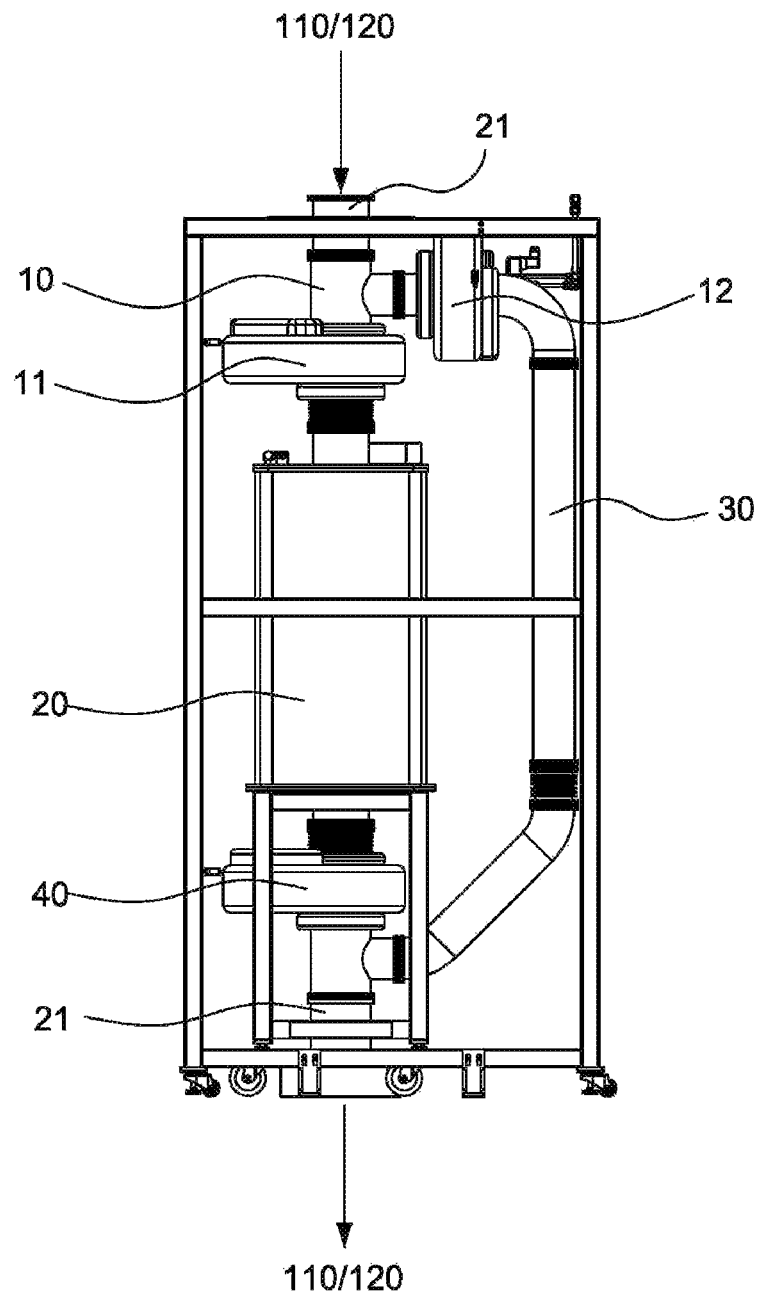

FIG. 1 is an overall configuration view of a process stop loss reduction system according to an embodiment of the present disclosure, and FIGS. 2 to 4 are exemplified views illustrating a main configuration of the process stop loss reduction system according to the embodiment of the present disclosure.

With reference to the drawings, a process stop loss reduction system through rapid replacement of an apparatus for trapping of a reaction by-product for a semiconductor process according to the present disclosure includes: a distributor 10 configured to distribute exhaust gas 120 or inert gas 110, which is supplied from a process chamber 60, to a flow path; a first on-off valve 11 configured to open or close the flow path for the exhaust gas 120 or the inert gas 110 distributed by the distributor 10; a second on-off valve 12 configured to open or close the flow path for the inert gas 110 distributed by the distributor 10; a trapping apparatus 20 having an inner trapping apparatus configured to receive the exhaust gas 120 in response to the opening or closing of the first on-off valve 11 and trap a reaction by-product or receive the inert gas 110 for a predetermined time after replacement of the trapping apparatus; a bypass pipe 30 configured to receive the inert gas in response to the opening or closing of the second on-off valve 12 and supply the inert gas to an exhaust pipe at a lower side of a heating gate valve; the heating gate valve 40 configured to receive the exhaust gas 120 or the inert gas from the trapping apparatus when the first on-off valve 11 is opened and supply the exhaust gas 120 or the inert gas to an exhaust pipe connected to a vacuum pump at a rear end or cut off the supply of the exhaust gas 120 or the inert gas; and a trapping system controller 50 configured to control operations of opening or closing the first on-off valve 11, the second on-off valve 12, and the heating gate valve.

The exhaust gas 120 may contain various process gas components 100 depending on a semiconductor to be manufactured in the process chamber. Examples of the process gas components include $TiCl_4$, $NH_3$, $SiH_4$, $SiCl_2H_2$, $WF_6$, Hf, and the like. However, the components of the exhaust gas 120 of the present disclosure are not limited to the above-mentioned gases.

A gas, which is used for cleaning or ventilation and hardly chemically reacts with other substances, is used as the inert gas 110. Examples of the inert gas include $N_2$, Ar, and the like. However, the inert gas of the present disclosure is not limited to the above-mentioned gas.

The distributor 10 is connected to the process chamber 60 through the exhaust pipe and supplies the supplied exhaust gas or inert gas to front ends of the first and second on-off valves 11 and 12. In one embodiment, the distributor 10 may be configured as a "T" pipe and configured to divide a single flow path into two flow paths.

The first and second on-off valves 11 and 12 may each be configured as an automatic valve so that the flow path is opened or closed by the trapping system controller 50.

That is, one side of the first on-off valve 11 is connected to the exhaust pipe, and the other side of the first on-off valve 11 is connected to the trapping apparatus 20, by means of the process chamber 60 and the distributor 10 used to manufacture the semiconductor. When a process chamber facility controller 70 detects a change in pressure in the trapping apparatus 20, the first on-off valve 11 operates, under the control of the process chamber facility controller 70, to supply the exhaust gas 120 or the inert gas 110, which is selectively supplied from the process chamber 60, to the trapping apparatus 20 or cut off the supply of the exhaust gas 120 or the inert gas 110 by the trapping system controller 50.

In this case, the operation of the first on-off valve 11 is performed by a motor or a pneumatic cylinder. The trapping system controller 50 controls a rotation direction of the motor or an operation direction of the pneumatic cylinder so that the process of supplying the gas to the flow path or cutting off the supply of the gas is quickly performed.

Likewise, one side of the second on-off valve 12 is connected to the exhaust pipe, and the other side of the second on-off valve 12 is connected to the bypass pipe 30, by means of the process chamber 60 and the distributor 10 used to manufacture the semiconductor. When the process chamber facility controller 70 detects a change in pressure in the trapping apparatus 20, the second on-off valve 12 operates, under the control of the process chamber facility controller 70, to supply the inert gas 110, which is selectively supplied from the process chamber 60, to the bypass pipe 30 or cut off the supply of the inert gas 110 by the trapping system controller 50.

In this case, the operation of the second on-off valve 12 is performed by a motor or a pneumatic cylinder. The trapping system controller 50 controls a rotation direction of the motor or an operation direction of the pneumatic cylinder so that the process of supplying the gas to the flow path or cutting off the supply of the gas is quickly performed.

The reason why the operations of the first and second on-off valves 11 and 12 are automatically performed is that the flow path needs to be quickly changed at the same time when the process chamber facility controller 70 detects a change in pressure in the trapping apparatus so that a semiconductor wafer, which is being manufactured in the process chamber, is not contaminated by introduced foreign substances or an optimally preset semiconductor production process condition is not changed. However, as necessary or in case of emergency, the first and second on-off valves 11 and 12 may be manually controlled and operated.

That is, the process chamber 60, which is connected to the trapping apparatus 20 through the first on-off valve 11, refers to a device for manufacturing a semiconductor chip by processing particular patterns by repeatedly performing a process of depositing a thin film on a wafer by using the introduced reactant gas and selectively etching the deposited thin film. The process chamber facility controller 70 detects the pressure in the trapping apparatus or the pressure in the process chamber and supplies the exhaust gas 120 or the inert gas to the process chamber 60 so that the process chamber 60 stably performs the process.

The reason why the process chamber facility controller 70 detects a change in pressure in the trapping apparatus 20 is to prevent the problem in that when the exhaust gas 120 is not smoothly discharged and trapped because of space clogging or the like caused by the reaction by-product accumulated as the trapping process is performed over a long period of time, the trapping apparatus 20 cannot perform the normal trapping process, a load is generated, an internal pressure increases, the pressure in the process chamber connected to the trapping apparatus 20 through an exhaust pipe 21 also increases, the optimal semiconductor production condition is affected, and a reverse flow of harmful gas into the process chamber contaminates the wafer being manufactured by a high-quality, high-efficiency process.

Non-illustrated pressure detection sensors are installed at one or more positions in the exhaust pipe, the process chamber, and the trapping apparatus so that the process chamber facility controller 70 detects the pressure change.

Meanwhile, the first and second on-off valves 11 and 12 may each have a heating function and heat the supplied exhaust gas or inert gas to prevent the trapping apparatus 20 or the bypass pipe 30 from being clogged.

The trapping apparatus 20 is installed at the rear end of the first on-off valve 11. At ordinary times, the trapping apparatus 20 is connected to the first on-off valve 11 through the flow path, such that the trapping apparatus 20 receives the exhaust gas 120 discharged from the process chamber 60, traps the reaction by-product, and discharges only the remaining exhaust gas to a vacuum pump 80 connected to the exhaust pipe 21 at the rear end. Thereafter, a scrubber 90 serves to purify the exhaust gas 120 and then discharge the exhaust gas 120 through the exhaust pipe 21.

In addition, during a process of replacing the trapping apparatus 20, the flow path for the first on-off valve 11 is blocked, the supply of the exhaust gas 120 is cut off, and the heating gate valve 40 at the rear end is closed.

In addition, after the trapping apparatus 20 is completely replaced, the heating gate valve 40 at the rear end is opened again, the heating gate valve 40 communicates with the exhaust pipe 21 of the vacuum pump through the flow path, and the flow paths are connected as the first on-off valve 11 at the front end is opened. Therefore, the trapping apparatus 20 receives the inert gas, which is discharged from the process chamber 60, and discharge the inert gas to the vacuum pump at the rear end before the trapping apparatus 20 receives the exhaust gas 120. Next, when the process chamber 60 restarts the process of producing the semiconductor, the trapping apparatus 20 receives the discharged exhaust gas 120 and traps the reaction by-product.

The trapping apparatus used in the present disclosure is not limited in structure or shape, and various trapping apparatuses may be mounted and connected.

For example, any one of inner trapping towers each having any one of structures having a combination of various trapping plates may be provided in a housing that constitutes the trapping apparatus. Further, the structure may trap the reaction by-product contained in the exhaust gas 120. A heater, which serves to set an appropriate temperature to trap the reaction by-product and prevent clogging of an inlet part of the trapping apparatus by maintaining a temperature of the exhaust gas, may be or may not be used for the provided trapping apparatus depending on the situation. In addition, a cooling means may be selectively provided in the housing or the inner trapping apparatus, such that a means capable of adjusting the internal temperature is provided.

The bypass pipe 30 is maintained in a state in which the flow path is blocked as the first on-off valve 11 is opened and the second on-off valve 12 is kept closed when the trapping apparatus normally performs the trapping operation. When the process chamber facility controller 70 detects a change in pressure in the trapping apparatus or the process chamber and then supplies the inert gas 110 into the process chamber instead of the process gas 100, the trapping system controller 50 circuit-connected to the process chamber facility controller 70 opens the second on-off valve 12 and blocks the flow path of the first on-off valve 11 at the same time so that the flow path communicates with the exhaust pipe 21 positioned at the lower side of the heating gate valve 40 positioned at the rear end of the trapping apparatus, and the inert gas flows to the vacuum pump through the exhaust pipe 21.

As described above, according to the present disclosure, the inert gas, which is supplied through the bypass pipe 30, flows to the vacuum pump 80 and the scrubber 90 for the time for which the trapping apparatus is replaced, such that the operations of the process chamber, the vacuum pump, and the scrubber are maintained.

The inert gas is supplied into the process chamber from an inert gas storage tank (not illustrated) by the process chamber facility controller 70 while the inert gas is supplied through the bypass pipe 30 of the present disclosure, i.e., while the trapping apparatus is replaced. In this case, the semiconductor, which is being manufactured in the process chamber is not removed, and the process is in a stopped state for a moment until the replacement of the trapping apparatus is completed. Therefore, because all the process conditions are not changed, the semiconductor manufacturing process is continuously performed when only the process gas 100 is supplied. Because the time required to replace the trapping apparatus is typically about three hours or less, the idle time of about three hours is required in case that the present disclosure system is applied.

The bypass pipe 30 may be configured as a metal pipe and fixed. Alternatively, the bypass pipe 30 may be configured as a flexible pipe and freely disposed.

The heating gate valve 40 is configured to block the flow in the flow path connected to the trapping apparatus by the trapping system controller 50 when the process chamber facility controller 70 detects a change in pressure in the trapping apparatus or the process chamber and then supplies the inert gas 110 into the process chamber instead of the process gas 100.

In addition, when the replacement of the trapping apparatus is completed, the heating gate valve 40 in the closed state is opened, the trapping system controller 50 controls and opens the first on-off valve 11 and controls and closes the second on-off valve 12, the flow path of the bypass pipe 30 is connected to the trapping apparatus, and at the same time, the trapping apparatus side flow path in the closed state is opened and connected to the trapping apparatus, such that the trapping apparatus receives the inert gas discharged from the process chamber 60 and discharges the inert gas to the vacuum pump at the rear end. Thereafter, the process chamber 60 restarts the process of producing the semiconductor, and the trapping apparatus receives the exhaust gas 120, traps the reaction by-product, and then discharges the remaining exhaust gas 120, such that the exhaust gas 120 is supplied to the exhaust pipe 21 connected to the scrubber 90 and the vacuum pump 80 at the rear end.

In addition, at ordinary times, the heating gate valve 40 is configured to increase the temperature to prevent the formation of the by-product in the valve and allow the system to operate smoothly when the replacement of the trapping apparatus is not performed. That is, the heating gate valve 40 is opened to communicate with the trapping apparatus, and the exhaust gas 120 is discharged through a discharge port of the trapping apparatus in the state in which the reaction by-product has been trapped as the exhaust gas passes through the trapping apparatus. In this case, the exhaust gas 120, which is heated again and has a raised temperature, is supplied to the scrubber through the vacuum pump at the rear end while being prevented from being adhered in the exhaust pipe 21 and the valve.

At ordinary times, the trapping system controller 50 performs control to allow the first on-off valve 11 and the heating gate valve 40 to communicate with the trapping apparatus through the flow paths. When the process chamber facility controller 70 detects a change in pressure in the trapping apparatus or the process chamber and then supplies the inert gas 110 into the process chamber instead of the process gas 100, the trapping system controller, which operates in conjunction with the process chamber facility controller in response to a signal, opens the second on-off valve 12, blocks the flow path of the first on-off valve 11, switches the supply flow path from the trapping apparatus to the bypass pipe, and blocks the flow path of the heating gate valve 40, such that the inert gas is supplied to the exhaust pipe 21 at the lower side of the heating gate valve through the bypass pipe 30.

The trapping apparatus 20 is quickly replaced as the trapping system controller 50 controls the flow path.

In addition, when the replacement of the trapping apparatus is completed, the trapping system controller 50 performs control to open the first on-off valve 11, close the second on-off valve 12, switch the flow path from the bypass pipe to the trapping apparatus, and open the flow in the flow path so that the heating gate valve 40 in the closed state is also connected to the trapping apparatus.

Therefore, when the first on-off valve 11 and the heating gate valve 40 communicate with the trapping apparatus 20, the inert gas discharged from the process chamber 60 is discharged to the vacuum pump at the rear end through the trapping apparatus 20. Thereafter, when the process chamber 60 restarts the process of producing the semiconductor, the trapping apparatus receives the exhaust gas 120, traps the reaction by-product, and then supplies the remaining exhaust gas 120 to the exhaust pipe 21 connected to the scrubber and the vacuum pump at the rear end.

Figure 5:
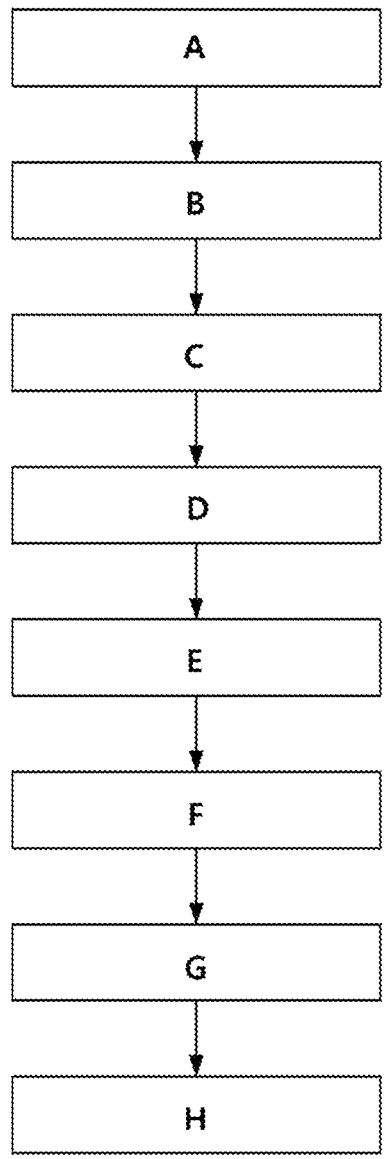
FIG. 5 is a flowchart illustrating a trapping method using the process stop loss reduction system according to the embodiment of the present disclosure.

FIG. 5 is a flowchart illustrating a trapping method using the process stop loss reduction system according to the embodiment of the present disclosure. After the process stop loss reduction system according to FIGS. 1 to 4 is provided, the trapping method performs the following steps of:

(A) performing the semiconductor manufacturing process in the process chamber;
(B) detecting pressure in the process chamber;
(C) switching the semiconductor manufacturing process to the idling state and then supplying the inert gas into the process chamber;
(D) supplying, by the trapping system controller, the inert gas to the bypass pipe by controlling the operation of opening or closing the first on-off valve, the operation of opening or closing the second on-off valve, and the process of opening or closing the heating gate valve;
(E) replacing the trapping apparatus;
(F) supplying, by the trapping system controller, the inert gas into the trapping apparatus by controlling the operation of opening or closing the first on-off valve, the operation of opening or closing the second on-off valve, and the operation of opening or closing the heating gate valve;
(G) performing the semiconductor manufacturing process by inputting the process gas into the process chamber; and
(H) proceeding with, by the trapping apparatus, the process of trapping the reaction by-product contained in the exhaust gas discharged from the process chamber.

According to the present disclosure, as the above-mentioned steps are performed, it is possible to proceed with the semiconductor production process by quickly replacing the trapping apparatus without a process stop loss such as preparation of replacement of the trapping apparatus and replacement and maintenance time, i.e., without stopping the operation of the semiconductor manufacturing process chamber in case that the pressure in the trapping apparatus and the pressure in the process chamber are increased by space clogging or the like caused by reaction by-products accumulated in the trapping apparatus for trapping of a reaction by-product contained in exhaust gas discharged from the process chamber during the semiconductor process.

The present disclosure is not limited to the specific exemplary embodiment described above, various modifications can be made by any person skilled in the art to which the present disclosure pertains without departing from the subject matter of the present disclosure as claimed in the claims, and the modifications are within the scope defined by the claims.

What is claimed is:

1. A process stop loss reduction system through rapid replacement of an apparatus for trapping a reaction by-product for a semiconductor process, which comprises a trapping apparatus configured to trap a reaction by-product in exhaust gas discharged from a process chamber during a semiconductor process, the process stop loss reduction system comprising:
a distributor (10) configured to distribute exhaust gas or inert gas, which is supplied from the process chamber (60), to a flow path;
a first on-off valve (11) configured to open or close the flow path for the exhaust gas or the inert gas distributed by the distributor (10);
a second on-off valve (12) configured to open or close the flow path for the inert gas distributed by the distributor (10);
a trapping apparatus (20) having an inner trapping apparatus configured to receive the exhaust gas in response to the opening or closing of the first on-off valve (11) and trap a reaction by-product or receive the inert gas;
a bypass pipe (30) configured to receive the inert gas in response to the opening or closing of the second on-off valve (12) and supply the inert gas to an exhaust pipe at a lower side of a heating gate valve;
the heating gate valve (40) configured to receive the exhaust gas or the inert gas from the trapping apparatus when the first on-off valve (11) is opened and supply the exhaust gas or the inert gas to an exhaust pipe connected to a vacuum pump at a rear end or cut off the supply of the exhaust gas or the inert gas; and
a trapping system controller (50) configured to control operations of opening or closing the first on-off valve (11), the second on-off valve (12), and the heating gate valve,
wherein the trapping apparatus (20) is configured to receive the inert gas from the process chamber (60) as the first on-off valve (11) and the heating gate valve (40) are controlled to be opened, receive the exhaust gas, and then trap the reaction by-product when a predetermined time elapses after the trapping apparatus (20) is replaced.

2. The process stop loss reduction system of claim 1, wherein the first on-off valve (11) or the second on-off valve (12) is controlled by the trapping system controller (50) so that a flow path thereof is opened or closed, the first on-off valve (11) is configured to supply the supplied exhaust gas or inert gas to the trapping apparatus (20), and the second on-off valve (12) is configured to supply the supplied inert gas to the bypass pipe (30).

3. The process stop loss reduction system of claim 1, wherein the first on-off valve (11) and the second on-off valve (12) each have a heating function.

4. The process stop loss reduction system of claim 1, wherein the bypass pipe (30) is connected to the exhaust pipe at the lower side of the heating gate valve.

5. The process stop loss reduction system of claim 1, wherein the heating gate valve (40), at ordinary times, prevents formation of a by-product in the valve by raising a temperature to allow the system to operate smoothly.

6. A process stop loss reduction system through rapid replacement of an apparatus for trapping a reaction by-product for a semiconductor process, which comprises a trapping apparatus configured to trap a reaction by-product in exhaust gas discharged from a process chamber during a semiconductor process, the process stop loss reduction system comprising:
a distributor (10) configured to distribute exhaust gas or inert gas, which is supplied from the process chamber (60), to a flow path;
a first on-off valve (11) configured to open or close the flow path for the exhaust gas or the inert gas distributed by the distributor (10);
a second on-off valve (12) configured to open or close the flow path for the inert gas distributed by the distributor (10);
a trapping apparatus (20) having an inner trapping apparatus configured to receive the exhaust gas in response to the opening or closing of the first on-off valve (11) and trap a reaction by-product or receive the inert gas;

a bypass pipe (30) configured to receive the inert gas in response to the opening or closing of the second on-off valve (12) and supply the inert gas to an exhaust pipe at a lower side of a heating gate valve;

the heating gate valve (40) configured to receive the exhaust gas or the inert gas from the trapping apparatus when the first on-off valve (11) is opened and supply the exhaust gas or the inert gas to an exhaust pipe connected to a vacuum pump at a rear end or cut off the supply of the exhaust gas or the inert gas; and a trapping system controller (50) configured to control operations of opening or closing the first on-off valve (11), the second on-off valve (12), and the heating gate valve, wherein the trapping system controller (50), at ordinary times, performs control to allow the heating gate valve (40) to communicate with the trapping apparatus through the flow path by closing the second on-off valve (12) and opening the first on-off valve (11), and wherein when a process chamber facility controller (70) detects a change in pressure in the trapping apparatus or the process chamber and then supplies the inert gas into the process chamber instead of process gas, the trapping system controller, which operates in conjunction with the process chamber facility controller in response to a signal, performs control to open the second on-off valve (12), block a flow path of the first on-off valve (11), switch the flow path from the trapping apparatus to the bypass pipe (30), block a flow path of the heating gate valve (40), and supply the inert gas to the exhaust pipe at the lower side of the heating gate valve through the bypass pipe (30), such that the trapping apparatus is capable of being replaced.

7. A process stop loss reduction system through rapid replacement of an apparatus for trapping a reaction by-product for a semiconductor process, which comprises a trapping apparatus configured to trap a reaction by-product in exhaust gas discharged from a process chamber during a semiconductor process, the process stop loss reduction system comprising:

a distributor (10) configured to distribute exhaust gas or inert gas, which is supplied from the process chamber (60), to a flow path;

a first on-off valve (11) configured to open or close the flow path for the exhaust gas or the inert gas distributed by the distributor (10);

a second on-off valve (12) configured to open or close the flow path for the inert gas distributed by the distributor (10);

a trapping apparatus (20) having an inner trapping apparatus configured to receive the exhaust gas in response to the opening or closing of the first on-off valve (11) and trap a reaction by-product or receive the inert gas;

a bypass pipe (30) configured to receive the inert gas in response to the opening or closing of the second on-off valve (12) and supply the inert gas to an exhaust pipe at a lower side of a heating gate valve;

the heating gate valve (40) configured to receive the exhaust gas or the inert gas from the trapping apparatus when the first on-off valve (11) is opened and supply the exhaust gas or the inert gas to an exhaust pipe connected to a vacuum pump at a rear end or cut off the supply of the exhaust gas or the inert gas; and a trapping system controller (50) configured to control operations of opening or closing the first on-off valve (11), the second on-off valve (12), and the heating gate valve, wherein when replacement of the trapping apparatus is completed, the trapping system controller (50) performs control to connect the heating gate valve in a closed state to the trapping apparatus to open a flow in the flow path, open the first on-off valve (11), close the second on-off valve (12), and switch the flow path from the bypass pipe to the trapping apparatus, such that the inert gas discharged from the process chamber (60) is discharged to the vacuum pump at the rear end through the trapping apparatus (20), and then the process chamber (60) restarts a process of producing a semiconductor, such that the trapping apparatus receives the exhaust gas, traps the reaction by-product, and then discharges the remaining exhaust gas, and the exhaust gas is discharged to the vacuum pump at the rear end.

8. The process stop loss reduction system of claim 1, wherein the process stop loss reduction system through rapid replacement of an apparatus for trapping of a reaction by-product for a semiconductor process is configured to replace the trapping apparatus in an idle state in which a semiconductor wafer manufacturing process environment is maintained in the process chamber in which a semiconductor wafer is being manufactured without stopping an operation of a process chamber facility.

* * * * *